(12) United States Patent
Taylor et al.

(10) Patent No.: US 8,552,417 B2
(45) Date of Patent: Oct. 8, 2013

(54) NANOPARTICLES

(75) Inventors: Peter Neil Taylor, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 42 days.

(21) Appl. No.: 13/145,650

(22) PCT Filed: Jan. 26, 2010

(86) PCT No.: PCT/JP2010/051316
§ 371 (c)(1),
(2), (4) Date: Jul. 21, 2011

(87) PCT Pub. No.: WO2010/085002
PCT Pub. Date: Jul. 29, 2010

(65) Prior Publication Data
US 2011/0272668 A1    Nov. 10, 2011

(30) Foreign Application Priority Data
Jan. 26, 2009 (GB) .................................. 0901225.3

(51) Int. Cl.
*H01L 33/06* (2010.01)
(52) U.S. Cl.
USPC .......................................... 257/13; 977/774
(58) Field of Classification Search
USPC ................ 257/13; 977/775, 776, 950, 774
See application file for complete search history.

(56) References Cited

U.S. PATENT DOCUMENTS

| 7,399,429 B2 * | 7/2008 | Liu et al. ............... 252/301.4 R |
| 7,867,557 B2 * | 1/2011 | Pickett et al. ............... 427/214 |
| 2005/0004293 A1 | 1/2005 | Peng et al. |
| 2005/0051769 A1 | 3/2005 | Jang et al. |
| 2005/0220694 A1 | 10/2005 | Winkler et al. |
| 2006/0001119 A1 | 1/2006 | Liu et al. |
| 2006/0014040 A1 * | 1/2006 | Peng et al. ............... 428/620 |
| 2006/0087048 A1 | 4/2006 | Mello et al. |
| 2006/0240227 A1 | 10/2006 | Zhang et al. |
| 2007/0064468 A1 | 3/2007 | Seol et al. |
| 2007/0111324 A1 | 5/2007 | Nie et al. |

(Continued)

FOREIGN PATENT DOCUMENTS

| JP | 2004-307679 A | 11/2004 |
| JP | 2005-101601 A | 4/2005 |

(Continued)

OTHER PUBLICATIONS

International Search Report for related International Application No. PCT/JP2010/051315 mailed Mar. 9, 2010 (previously filed on Oct. 7, 2011).

(Continued)

*Primary Examiner* — George Fourson, III
(74) *Attorney, Agent, or Firm* — Renner, Otto, Boisselle & Sklar, LLP

(57) ABSTRACT

The present application provides a light-emissive nitride nanoparticle, for example a nanocrystal, having a photoluminescence quantum yield of at least 1%. This quantum yield is significantly greater than for prior nitride nanoparticles, which have been only weakly emissive and have had poor control over the size of the nanoparticles produced. The nanoparticle includes at least one capping agent provided on a surface of the nitride crystal and containing an electron-accepting group for passivating nitrogen atoms at the surface of the crystal. The invention also provides non-emissive nitride nanoparticles.

34 Claims, 12 Drawing Sheets

M = any metal, boron or silicon
$X_1, X_2, ...X_n$ = any electron donating functional group
$Y_1, Y_2, ...Y_n$ = any electron accepting functional group

(56) References Cited

U.S. PATENT DOCUMENTS

| | | | |
|---|---|---|---|
| 2007/0111488 A1 | 5/2007 | Chakraborty et al. | |
| 2007/0297969 A1 | 12/2007 | Van Patten et al. | |
| 2008/0020383 A1 | 1/2008 | Koshy et al. | |
| 2008/0173845 A1* | 7/2008 | Ryowa et al. | 252/301.36 |
| 2008/0231170 A1* | 9/2008 | Masato et al. | 313/501 |
| 2008/0237612 A1* | 10/2008 | Cok | 257/88 |
| 2009/0047773 A1* | 2/2009 | Mitchell et al. | 438/478 |
| 2009/0061226 A1* | 3/2009 | Banin et al. | 428/402 |
| 2010/0283005 A1* | 11/2010 | Pickett et al. | 252/301.6 S |
| 2013/0178047 A1* | 7/2013 | Harris et al. | 438/478 |

FOREIGN PATENT DOCUMENTS

| | | |
|---|---|---|
| JP | 2007-070207 A | 3/2007 |
| JP | 2007-077246 A | 3/2007 |
| JP | 2007-514133 A | 5/2007 |
| JP | 2008-94968 A | 4/2008 |
| JP | 2009-013283 A | 1/2009 |
| WO | 01/52741 A1 | 7/2001 |
| WO | 03/054953 A1 | 7/2003 |
| WO | 2005/001906 A2 | 1/2005 |
| WO | 2005/110916 A2 | 11/2005 |
| WO | 2006/027778 A2 | 3/2006 |
| WO | 2007/020416 A1 | 2/2007 |
| WO | 2008/094292 A1 | 8/2008 |
| WO | 2009/040553 A2 | 4/2009 |

OTHER PUBLICATIONS

International Search Report for related International Application No. PCT/JP2010/051315 mailed Mar. 9, 2010.
British Search Report for related British Application No. GB0901226.1 dated Apr. 7, 2009.
Cumberland et al., "Thermal Control of Metathesis Reactions Production GaN and InN†", J. Phys. Chem.. B 2001, 105(47), pp. 11922-11927.
Co-pending U.S. Appl. No. 13/145,385, filed Jul. 20, 2011.
Form PCT/ISA/237 for International Application No. PCT/JP2010/051316 dated Mar. 2, 2010.
British Search Report for corresponding British Application No. GB0901225.3 dated Apr. 15, 2009.
Skoog et al., "Principles of Instrumental Analysis" fifth edition, Saunders College Publishing, p. 360-361.
Alivisatos et al., "Synthesis of Soluble and Processable Rod-, Arrow-, Teardrop-, and Tetrapod-Shaped CdSe Nanocrystals", J. Am. Chem. Soc., 2000, 122, 12700.
Bawendi et al., "Synthesis and Characterization of a Size Series of Highly Luminescent Nanocrystallites", J. Phys. Chem, B. 1997, 101, 9463.
Li et al., "One-Pot Synthesis of Highly Luminescent InP/ZnS Nanocrystals Without Precursor Injection", J. Am. Chem. Soc., 2008, 130, 11588.
Bawendi et al., "Synthesis and Characterization of Nearly Monodisperse CdE (E=S, Se, Te) Semiconductor Nanocrystallites", J. Am. Chem. Soc., 1993, 115, 8706.
Peng et al., "Control of Photoluminescence Properties of CdSe Nanocrystals in Growth", J. Am. Chem. Soc., 2002, 124. 2049.
Battaglia et al., "Formation of High Quality InP and InAs Nanocrystals in a Noncoordinating Solvent", Nano Letters, 2002, 2, 1027.
Nann et al., "Rapid Synthesis of Highly Luminescent InP and InP/ZnS Nanocrystals", J. Mater. Chem., 2008, 18, 2653.
Gillian et al., "Low-temperature solvothermal synthesis of nanocrystalline indium nitride and Ga-in-N composites from the decomposition of metal azides", J. Mater. Chem., 2006, 38, 3774.
Van Patten et al., "New Pyrolysis Route to GaN Quantum Dots", Chemistry of Materials, 2006, 18, 3915.
Strouse et al., "Microwave-Enhanced Reaction Rates for Nanoparticle Synthesis", J. Am. Chem. Soc., 2005, 127, 15791.
Neumayer et al., "Growth of Group III Nitrides. A Review of Precursors and Techniques", Chem. Mater., 1996, 8, 25.
Xie et al., "Indium nitride from Indium Iodide at Low Temperatures: Synthesis and Their Optical Properties", New J. Chem., 2005, 29, 1610.
Mićić et al., "Synthesis, Structure, and Optical Properties of Colloidal GaN Quantum Dots", Appl. Phys. Lett., 1999, 74, 478.
Cole-Hamilton et al., "Nanoparticles from the Decomposition of the Complex", J. Mater. Chem., 2004, 14, 3124.
Rao et al., "InN Nanocrystals, Nanowires, and Nanotubes", Small, 2005, 1, 91.
L.E. Brus, "A simple model for the ionization potential, electron affinity, and aqueous redox potentials of small semiconductor crystallites", J. Chem. Phys. vol. 79., No. 11, Dec. 1983, pp. 5566-5571.
Office Action mailed Apr. 4, 2013 in copending U.S. Appl. No. 13/145,385.

* cited by examiner

M = any metal, boron or silicon
$X_1, X_2, ...X_n$ = any electron donating functional group
$Y_1, Y_2, ...Y_n$ = any electron accepting functional group

NANOPARTICLES

TECHNICAL FIELD

This invention relates to semiconductor nanoparticles, for example nanocrystals having nanometer dimensions, and in particular to such materials in a nitride material system. Such materials can be used in a wide range of applications including phosphor-converted LEDs, emissive EL displays, solar cells and bio-imaging.

BACKGROUND ART

Semiconductor nanocrystals whose dimensions are comparable to the bulk exciton diameter show quantum confinement effects. This is seen most clearly in the optical spectra which shift to blue wavelengths as the size of the crystal is reduced.

Semiconductor nanocrystals made from a wide range of materials have been studied including many II-VI and III-V semiconductors. In addition to spherical nanocrystals, rod-, arrow-, teardrop- and tetrapod-shaped nanocrystals [Alivisatos et al., J. Am. Chem. Soc, 2000, 122, 12700; WO03054953] and core-shell structures [Bawendi, J. Phys. Chem. B, 1997, 101, 9463; Li and Reiss, J. Am. Chem. Soc., 2008, 130, 11588] have also been prepared. To control the size and shape of such nanocrystals their synthesis is generally performed in the presence of one or more capping agents (sometime called surfactants or coordinating solvents). Such capping agents control the growth of the nanocrystals and also increase the strength of the light emission though the passivation of surface states. A wide range of capping agents have been employed including phosphines [Bawendi et. al., J. Am. Chem. Soc., 1993, 115, 8706], phosphine oxides [Peng et. al., J. Am. Chem. Soc., 2002, 124, 2049], amines [Peng et. al., J. Am. Chem. Soc., 2002, 124, 2049], fatty acids [Battaglia and Peng, Nano Lett., 2002, 2, 1027; Peng et. al., J. Am. Chem. Soc., 2002, 124, 2049], thiols [Li and Reiss, J. Am. Chem. Soc., 2008, 130, 11588] and more exotic capping agents such a metal fatty acid complexes [Nann et. al., J. Mater. Chem., 2008, 18, 2653].

Methods to prepare semiconductor nanocrystals include solvothermal reactions [Gillan et. al., J. Mater. Chem., 2006, 38, 3774], hot injection methods [Battaglia and Peng, Nano Lett., 2002, 2, 1027], simple heating processes [Van Patten et. al., Chem. Mater., 2006, 18, 3915], continuous flow reactions [US2006087048] and microwave assisted synthesis [Strouse et. al., J. Am. Chem. Soc., 2005, 127, 15791].

One of the most interesting classes of semiconductors is the III-nitrides, such as AlN, GaN, InN and their respective alloys. These are used for the manufacture of blue light-emitting diodes, laser diodes and power electronic devices. Nitrides are also chemically inert, are resistant to radiation, and have large breakdown fields, high thermal conductivities and large high-field electron drift mobilities, making them ideal for high-power applications in caustic environments [Neumayer at. al., Chem., Mater., 1996, 8, 25]. The band gaps of aluminium nitride (6.2 eV), gallium nitride (3.5 eV) and Indium nitride (0.7 eV) [Gillan et. al., J. Mater. Chem., 2006, 38, 3774] mean that nitrides span much of the ultraviolet, visible and infrared regions of the electromagnetic spectrum. The fact that alloys of these materials have direct optical band gaps over this range makes these very significant for optical devices. In the case of nanocrystals based on III-nitride semiconductors, tuning the band gap through alloying and quantum confinement effects opens up the possibility of making unique nanocrystalline phosphors spanning a wide region of the electromagnetic spectrum. However, to date, routes to fabricate nitride nanocrystals have resulted in only weakly emissive materials and have had poor control over the size of the nanocrystals produced.

Nanocrystalline indium nitride and indium gallium nitride have been prepared from the solvothermal reaction of metal halides with sodium azide [Gillan et. al., J. Mater. Chem., 2006, 38, 3774]. No emission spectra of the material were presented although some images from a fluorescence microscope were included. Nanocrystalline indium nitride has also been prepared from the solvothermal reaction of indium iodide with sodium amide [Xie et. al., New. J. Chem., 2005, 29, 1610]. In this work indium nitride nanocrystals were prepared and emission spectra are reported but no indication as to the intensity of the emission, such as a photoluminescent quantum yield, is reported. Other workers have attempted to prepare nitride nanocrystals in the presence of capping agents, but strong emission of light has never been reported in nitride nanocrystals prepared in these ways. [Mićić et. al., Appl. Phys. Lett., 1999, 74, 478; Van Patten et. al., Chem. Mater., 2006, 18, 3915; Cole-Hamilton et. al., J. Mater. Chem., 2004, 14, 3124; Rao et. al., Small, 2005, 1, 91].

US 2008/0173845 proposes a method of producing, with high synthesis yield, a coated nanocrystalline phosphor by heating a mixed solution containing a core of a group IIIB nitride semiconductor, a nitrogen-containing compound, a group IIIB element-containing compound and modified organic materials. The document states that the method leads to a nanocrystal with improved luminous efficiency, but no values for the photoluminescence quantum yield are given.

US 2006/000119 and US2006/0014040 disclose a semiconductor nano crystal complex in which a metal layer is formed on the outer surface of a semiconductor nanocrystal core.

US 2006/240227 discloses various semiconductor nanocrystals. The described examples relate primarily to CdSe or CdSe/ZnS structures. The document refers to a quantum yield for fluorescence of 45% and to a quantum yield in photoluminescence of 40-90%, in connection with CdSe/ZnS structures. Methods similar to those proposed in this document have been applied to nitride systems and have been found not to lead to emissive materials.

WO 01/52741 proposes a nanocrystal intended to allow in vivo glucose measurement, by illuminating the nanocrystal and measuring the emitted light output. It does not give any values for the PLQY of the nanocrystals.

US 2007/0111488 proposes a method for the fabrication of non-polar indium gallium nitride films.

WO 2007/020416 and WO2009/040553 (which was not published until April 2009) relate to the fabrication of core-shell structures, in particular how the core and shell are fabricated. They do not primarily relate to nitrides. They propose the use of organic capping agents to cap surface atoms which are not fully co-ordinated.

WO 2008/094292 relates to manufacture of a semiconductor nanostructure, including core-shell structures. It proposes using a few specified chelating ligand solutions such as, for example, TOPO (trioctylphosphine oxide) and TOP (trioctylphosphine).

WO2009/040553, which was not published until April 2009, relates to the fabrication of core-shell structures in general, in particular how the core and shell are fabricated. It proposes use of standard organic molecules as capping agents. It also proposes formation of a metal oxide shell, using a metal carboxylate as a precursor.

WO 2007/020416 contains generally similar teaching to WO2009/040553 (with both documents being by the same applicant). It again proposes use of standard organic molecules as capping agents.

WO 2008/094292 relates to manufacture of a semiconductor nanostructure, including core-shell structures. It proposes growth in a "chelating ligand solution", and proposes various lyophilic surfactant molecules for this.

SUMMARY OF INVENTION

A first aspect of the present invention provides a light-emissive nitride nanoparticle having a photoluminescence quantum yield of at least 1%.

The "photoluminescence quantum yield" of a nitride nanoparticle is the ratio, when the nanoparticle is illuminated by an exciting light source to cause the nanoparticle to photoluminesce, of the number of photons emitted by the nanoparticle to the number of photons absorbed by the nanoparticle.

It should be noted that the term "photoluminescence quantum yield" should not be confused with the term "photoluminescence quantum efficiency" which is sometimes used in the art. The "photoluminescence quantum efficiency" takes into account the energy of the photons which are absorbed and emitted by a material. In cases where the excitation and emission wavelengths are similar the photoluminescence quantum yield and photoluminescence quantum efficiency will have similar values; however in cases where the excitation wavelength is shorter and hence of higher energy than the emission wavelength the photoluminescence quantum efficiency will be lower than the photoluminescence quantum yield.

This invention discloses highly light-emissive nitride nanoparticle, for example nanocrystals. Nitride nanocrystals described in the prior art are not highly emissive, and have a photoluminescence quantum yield of well below 1%.

The light-emissive nitride nanoparticle may have a photoluminescence quantum yield of at least 5%, or of at least 10%, or of at least 20%.

The light-emissive nitride nanoparticle may comprise: a nitride crystal, at least one dimension of the crystal being of a nanoscale dimension; and at least one capping agent provided on a surface of the nitride crystal and containing an electron-accepting group for passivating nitrogen atoms at the surface of the crystal. The emissive nitride nanocrystals of the invention have been prepared for the first time by performing the synthesis of a metal nitride in the presence of capping agents which are able to coordinate effectively to the surface of the growing crystal. It has been found that providing a capping agent having an electron-accepting group significantly increases the quantum yield of the resultant nitride nanoparticle—prior art nitride nanoparticles have a photoluminescence quantum yield of well below 1%, whereas nitride nanoparticles manufactured by a method of the present invention can have a photoluminescence quantum yield of 20% or greater.

A second aspect of the invention provides a nitride nanoparticle comprising: a nitride crystal, at least one dimension of the crystal being of a nanoscale dimension; and at least one capping agent provided on a surface of the nitride crystal and containing an electron-accepting group, the electron accepting group containing a metal, boron or silicon.

A third aspect of the invention provides a nanoparticle comprising: a core; a nitride layer disposed around the core; and at least one capping agent provided on a surface of the nitride layer and containing an electron-accepting group, the electron accepting group containing a metal, boron or silicon.

The core may be a nitride core, but a nanoparticle of this aspect may alternatively have a core that is not a nitride core.

A nanoparticle of the second or third aspect may be light emissive or it may be non-light emissive. In the case that it is light emissive, it may have a photoluminescence quantum yield of at least 1%. It may have a photoluminescence quantum yield of at least 5%, or of at least 10%, or of at least 20%.

The at least one capping agent may further contain an electron-donating group for passivating metal, boron or silicon atoms at the surface of the crystal or the nitride layer. This may help to promote solubility of one or more constituents in the reaction mixture during growth of the nanocrystals, thereby to provide a more homogeneous solution which should allow for more controlled growth of the nanocrystals.

The at least one capping agent may include a capping agent having an electron-accepting group for passivating nitrogen atoms at the surface of the crystal or the nitride layer and an electron-donating group for passivating metal, boron or silicon atoms at the surface of the crystal or the nitride layer.

The electron-accepting group may include a metal, boron or silicon. Such an electron-accepting group has been found to be effective in the manufacture of a nitride nanoparticle with a high quantum yield.

The electron-accepting group may include a Group II metal or a Group III element. Alternatively it may include a metal selected from the group consisting of: Sc, Ti, V, Cr, Mn, Fe, Co, Ni, Cu, Zn, Zr, Ag, Mo, Ru, Pd, Cd, Ta, W, Os, Ir, Pt, Au and Hg. Alternatively, it may include a metal selected from the group consisting of Al, Ga, In. The metal may be provided as a metal amine, metal carboxylate, metal acetoacetonate, metal sulfonate, metal phosphonate, metal thiocarbamate, or metal thiolate.

The electron-donating group may be selected from the group consisting of: phosphines, phosphine oxides, carboxylic acids, carboxylates, amines, sulfonates, esters, thiols and thiolates.

The nitride crystal may be a crystal of a nitride having the formula $M_xN_y$ where M denotes a metal, boron or silicon and x and y are integers. Alternatively, the nitride crystal may comprise two or more metals, boron or silicon and have the general formula $M1_{x1}M2_{x2}M3_{x3}\ldots Mn_{xn}N_y$ where M1, M2, M3 ... Mn denote different metals, boron or silicon, x1, x2, x3 ... xn denote the quantities of the metals, boron or silicon and y denotes the quantity of nitrogen.

The or each metal may be a Group III metal. (It should be noted that the term "Group III metal" differs from the term "Group III element" in that the term "Group III element" includes all Group III metals (ie, Al, Ga, In, Tl) and also includes boron. Although boron is a "Group III element" it is not generally regarded as a metal and hence is not a "Group III metal".

The nitride crystal may be a crystal of indium nitride. Indium nitride has a bandgap in the infra-red part of the spectrum so that, with confinement effects, indium nitride nanoparticles have bandgaps in the visible region of the spectrum.

The at least one capping agent may include a zinc carboxylate.

The nitride crystal may form a core of the nanoparticle and the nanoparticle may further comprise a shell disposed around the core.

The core may be an InN core or an InGaN core. The shell may be a ZnS shell.

Alternatively, the nitride layer may form a shell disposed around the core of the nanoparticle. The core may be an InN core or an InGaN core. The nanoparticle may further comprise another shell disposed around the nitride layer, wherein the another shell is formed of ZnS.

This invention discloses highly light-emissive nitride nanoparticle, for example nanocrystals. Nitride nanocrystals described in the prior art are not highly emissive.

The nitride nanocrystals of the invention have been prepared for the first time by performing the synthesis of a metal nitride in the presence of capping agents which are able to coordinate effectively to the surface of the growing crystal. For the first time highly emissive nitride nanocrystals have been prepared with good control over their size.

In order to achieve this, it was first realised that the reaction of indium iodide with sodium amide successfully led to the formation of nanocrystalline indium nitride when the mixture was heated to 225° C. in a high boiling point solvent as opposed to the high pressure solvothermal route which is described in the prior art. Secondly, it was identified that the addition of an alkyl thiol (such as 1-hexadecane thiol) led to the formation of soluble indium nitride nanocrystals which were however, not highly emissive. Finally, the addition of zinc stearate to the reaction led to the formation of highly emissive indium nitride nanocrystals whose size and corresponding electronic spectra were simply controlled by the length of the reaction, which was varied between 5 and 60 minutes. In addition it was realised that zinc sterate helps to solubilise the sodium amide in the reaction mixture to provide a more homogeneous solution which is expected to allow for more controlled growth on the nanocrystals.

It is believed that the zinc atom in the zinc stearate is able to coordinate to the nitrogen atoms on the surface of the nanocrystal which allows controlled growth of the nanocrystals and also passivates the surface and provides strong emission. This provides a significant advantage over the prior art.

Compared to other semiconductors the nitrides span a wider range of the electromagnetic spectrum and like other III-V materials they have large exciton diameters suggesting they should have more pronounced quantum size effects on the optical spectra [Brus, J. Chem. Phys., 1983, 33, 6976]. This property is seen in the emission spectra of indium nitride nanocrystals prepared using the current invention shown in FIG. 2 which shows tunability over at least the range from 480 nm to 850 nm which is a larger range than nanocrystals made from any other material known in the prior art. At the present time the majority of emissive nanocrystals are composed of II-VI materials such as cadmium sulphide, cadmium selenide and lead sulphide. The presence of highly toxic heavy metals in these materials also gives the nitride nanocrystals of the present invention a significant advantage over the prior art. Ever tightening regulations and consumer awareness make using toxic materials in consumer products increasingly difficult. Another advantage is the low cost of all the starting materials used to prepare the nitride nanocrystals described here and the simple one step process used to prepare the nanocrystals from these materials.

DESCRIPTION OF EMBODIMENTS

Figure 1:
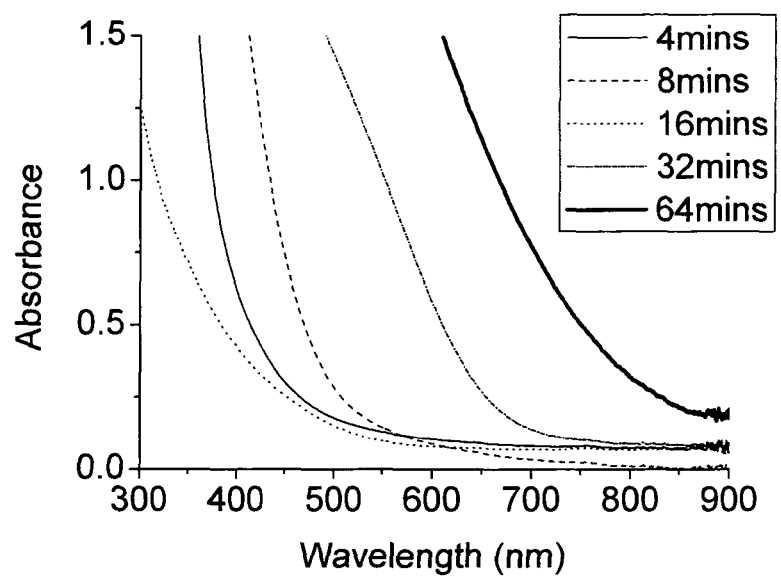
FIG. 1 shows absorption spectra of a set of indium nitride nanocrystal solutions obtained from a single reaction at different times.

This invention relates to nanoparticle, for example nanocrystals, of semiconducting compounds. More specifically it relates to emissive nanoparticle, for example nanocrystals, of metal nitrides of the general formulae $M_xN_y$, where M is a metal, silicon or boron and x and y are integers which are required to balance the stoichiometry. The invention also relates to emissive nanocrystals of alloys of two or more nitrides, with the general formulae $M1_{x1}M2_{x2}M3_{x3}\ldots Mn_{xn}N_y$ where M1, M2, M3 ... Mn correspond to different metals, silicon or boron, the numbers x1, x2, x3 ... xn give the relative quantities of the metals, boron or silicon in the alloy and y is the quantity of nitrogen required to balance the stoichiometry. More specifically the invention relates to emissive nanocrystals of nitrides of the group III elements and their alloys, with the general formula $B_{x1}Al_{x2}Ga_{x3}In_{x4}Tl_{x5}N$, where the numbers x1, x2, x3, x4 and x5 range from 0 to 1 and give the relative quantities of the element in the alloy and x1+x2+x3+x4+x5=1 (ie, y=1). More specifically this invention relates to emissive InN nanocrystals.

The present invention makes possible the fabrication of nanoparticles, for example nanocrystals, having a uniform size. The nanocrystals may be fabricated such that their diameters range from about 1 nm to about 100 nm and more specifically from about 1 nm to about 30 nm. The invention may be used to fabricate nanocrystals of a range of shapes such as roughly wire-, platelet-, spherical, rod-, arrow-, teardrop- and tetrapod-shapes. In addition the nanocrystals provided by this invention may have a core-shell structure where a shell of a second material is grown directly onto the surface of the nitride nanocrystal (which forms the core of the core-shell structure). More than one such shell may be grown. This shell may be made from a different nitride to that used for the core or an alternative III-V or II-VI semiconductor or any other suitable material. Ideally the band gap of the shell material will be larger that that of the nitride which forms the core to help confine the excited state within the core of the nanocrystals; this is known to improve the intensity of the emission from such materials.

Forming nanocrystals as disclosed in this invention requires a source of metal, boron or silicon to form the nitride nanocrystals. Any compound containing metal, boron or silicon may be considered. Specific examples which may be preferred include the following; metal, boron or silicon fluorides, chlorides, bromides, iodides, acetates, carboxylates, alkoxides, hydroxides, trifluormethanesulfonates, oxides, sulphides, sulphates, sulphites, carbonates, nitrates, nitrites, azides, amides, alkyls, phosphonates and phosphides. One or more sources of metal, boron or silicon may be used to produce nanocrystals consisting of a nitride alloy such as InGaN. In a preferred embodiment the source is an iodide such as $InI_3$, $GaI_3$ etc.

Forming nanocrystals as disclosed in this invention also requires a source of nitrogen to form the nitride nanocrystals. Any suitable nitrogen containing compound may be considered. Specific examples which may be preferred include ammonia, metal azides, metal nitrides, amines (such as $N(SiR_3)_3$, $NH(SiR_3)_2$, $NH_2(SiR_3)$, $NR_3$, $NHR_2$, $NH_2R$ where R is an alkyl group such as $-(CH_2)_nCH_3$ where n is an integer, any branched alkyl group such as $-C(CH_3)_3$ or $-CO_2C(CH_3)_3$), metal amides (such as $M_x(N(SiR_3)_2)_y$ and $M_x(NR_2)_y$ where R is H or an alkyl group such as $-(CH_2)_nCH_3$ where n is any integer or any branched alkyl group such as $-C(CH_3)_3$ or $-CO_2C(CH_3)_3$), M is a metal preferably a group 1 or group 2 metal such as Li, Na, K, Ca and Mg, x and y are integers required to balance the stoichiometry). In the preferred embodiment the source of nitrogen is $NaNH_2$, $LiNH_2$ or $KNH_2$.

In addition to using separate materials to provide the metal (or silicon or boron) and nitrogen required to form the nitride nanocrystals of the invention it is also within the scope of the present invention to use a single material to provide both the metal (or silicon or boron) and nitrogen required to from the metal (or silicon or boron) nitride nanocrystals. Any suitable material can be used, specific examples include compounds such as $M(NR_2)_x$ (where M is the metal (or silicon or boron) to be included, x is a number required to balance the stoichiometry in the nitride and R is H, an alkyl group such as $-(CH_2)_nCH_3$ where n is an integer, any branched alkyl group such as $-C(CH_3)_3$ or $-CO_2C(CH_3)_3$), $M(N(SiR_3)_x$ (where M is the metal (or silicon or boron) to be included in the nitride x is a number required to balance the stoichiometry and R is an alkyl group such as $-(CH_2)_nCH_3$ where n is an integer, any branched alkyl group such as $-C(CH_3)_3$ or $-CO_2C(CH_3)_3$), metal amide polymers, metal azide complexes and metal urea complexes.

A further feature of the fabrication of nanocrystals of the current invention is the choice of capping agent used in order to control the growth of the nanocrystals and passivate the surface of the nanocrystals to enable strong emission. A capping agent consists of a functional group which is able to coordinate to the surface of the metal (or silicon or boron) nitride nanocrystal by means of either (or both of) an electron donating functional group or electron accepting functional group. As is known, a "functional group" is a specific group of atoms within a molecule, in particular an organic molecule, that is responsible for the characteristic chemical reactions of the molecule.

A capping agent may also optionally contain a long straight or branched alkyl chain to solubilise the nanocrystal in non polar solvents such as toluene, hexane and diethyl ether. The alkyl chain may optionally also be modified or functionalised in such a way to enable the nanocrystal to dissolve in polar solvents such as methanol, ethanol and water. This may for example be achieved by appending polar functional groups to the alkyl chain such as $-P(O)(OM)_2$, $-OP(O)(OM)_2$, $-C(NH)OM$, $-CO_2M$, $-SO_3M$, $-OSO_3M$ and $-NH_4X$ where M is a metal and X is a counter ion. An alternative strategy to enable the nanocrystals to dissolve in polar solvents is to use an alkyl chain containing a multitude of ether linkages ($-CH_2-O-CH_2-$). In addition to providing solubility in both polar and non-polar solvents the alkyl chain attached to the nanocrystal can also be modified to allow attachment of the nanocrystal to other species or materials which may be desirable for some applications. Derivatives containing specific binding sites for other species are also part of the current invention and may be useful in areas such as bio imaging, pollution monitoring and such like.

In a further embodiment the alkyl chain may be chosen such that the nanocrystal can be integrated into a solid matrix such as a polymer, plastic, glass etc. In a further embodiment the alkyl chain may be chosen such that the nanocrystal can be modified in such a way that it can be polymerised. In a preferred embodiment a simple straight alkyl chain is used with between 5 and 30 $CH_2$ units and more ideally 10-20 $CH_2$ units.

Regarding the choice of electron donating group (if present) any electron donating functional groups may be suitable but functional groups such as phosphines, phosphine oxides, carboxylic acids, carboxylates, amines, sulfonates, esters, thiols and thiolates are preferred. In a preferred embodiment thiolates are chosen as the electron donating functional group.

Regarding the choice of electron accepting functional group, an electron accepting functional group that contains a suitable metal, silicon or boron may be used. As noted above, the electron accepting functional group is able to coordinate to the surface of the nanocrystal, and this is believed to occur by the individual metal (or silicon or boron) atoms of the electron accepting functional group coordinating to nitrogen atoms on the surface of the nanocrystal such that the nitrogen atoms are passivated and do not quench the fluorescence of the nanocrystal. It may be preferred to use an electron accepting functional group that contains any group II or group III metal or one of the following metals (Sc, Ti, V, Cr, Mn, Fe, Co, Ni, Cu, Zn, Zr, Ag, Mo, Ru, Pd, Ag, Cd, Ta, W, Os, Ir, Pt, Au, Hg). In a preferred embodiment an electron accepting functional group that contains Zn is used.

The electron accepting functional group, also contains a moiety that serves to connect the metal to the alky chain. The electron accepting functional group is thus constituted by the combination of the metal (or silicon or boron) and the moiety, and may also be regarded as a "metal (or silicon or boron) complex". It is important to note that, although the electron accepting functional group may contain metal atoms, the individual metal atoms form constituents in a metal complex and do not bond together to form a bulk metal having free electrons available for conduction. As the moiety of the electron accepting functional group, any moiety can be used such as amines, carboxylates, acetoacetonates, sulfonates, phosphonates, thiocarbamates, thiolates. In a preferred embodiment a zinc carboxylate such as zinc stearate is used as the electron accepting functional group.

In one embodiment a single capping agent is used to provide both an electron donating group and an electron accepting group; there are two possibilities here—either the capping agent may contain a functional group that is able to act as both a electron donating and electron accepting group or the capping agent may contain two functional groups, one acting as a electron donating group and the other acting as an electron accepting group. In another embodiment more than two different capping agents are used. In the preferred embodiment one capping agent is used as an electron donor and one is used as a electron acceptor.

Figure 8:
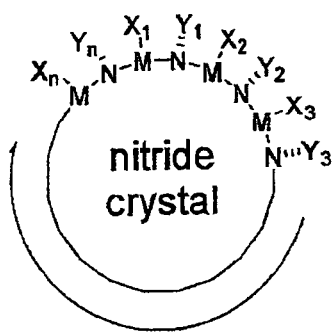
FIG. 8 shows a proposed generalised chemical structure of a highly emissive nitride nanocrystal.
Figure 9:
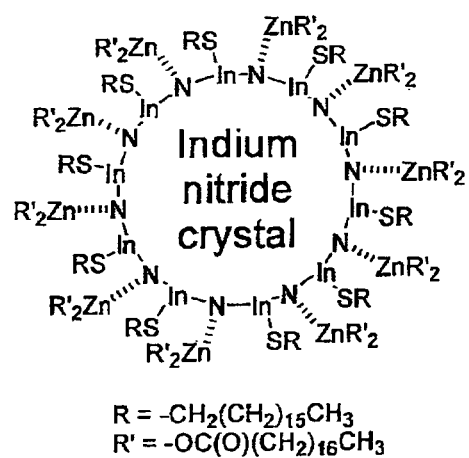
FIG. 9 shows a proposed chemical structure of a specific example of a highly emissive indium nitride nanocrystal.

FIG. 8 illustrates a proposed structure for the nanocrystals disclosed in this invention. This consists of a nitride crystal which has both electron donating and electron withdrawing functional groups attached to the surface of the nanocrystal. In the proposed structure the electron donating functional groups passivate the metal (or silicon or boron) atoms on the surface of the crystal and the electron accepting groups passivate the nitrogen atoms. Whereas nanocrystals made from materials other than metal nitrides generally use hydrogen bonds to passivate the non-metallic element this appears ineffective in the case of metal (or silicon or boron) nitrides. Therefore it is disclosed here that metal (or silicon or boron) complexes are able to effectively passivate the surface of the nanocrystal and hence provide strong light emission. FIG. 9 illustrates a specific example of the proposed structure where zinc stearate and hexadecane thiolate are coordinated to the surface on an indium nitride nanocrystal. The zinc stearate molecules passivate the nitrogen atoms at or near the surface of the indium nitride nanocrystal, and the hexadecane thiolate molecules passivate the metal atoms at or near the surface of the indium nitride nanocrystal.

One application of nanocrystals of the current invention is the use of metal nitride nanocrystals as phosphors in a range of lighting applications where a separate light source is used to excite the nitride nanocrystal phosphor. In one embodiment nitride nanocrystal phosphors emitting in a narrow spectral range can be used to make a light that emits pure saturated colour in any region of the spectrum. In a further embodiment mixing a range of different sized nitride nanocrystals will enable light of any colour (or of any colour range) to be generated by this invention. A preferred embodiment is when the light source used to illuminate the nanocrystals is a light emitting diode such that a phosphor converted light emitting diode is produced. Nanoparticles obtained by a method of the invention may be disposed over the body of an LED, or possibly incorporated within the LED body; in use, the nanoparticles would absorb light from the LED and re-emit it so that the output would consist either of a mixture of the LED output light and light re-emitted by the nanoparticles or (if the nanoparticles absorbed substantially all the LED output light) solely of light re-emitted by the nanoparticles.

Figure 10:
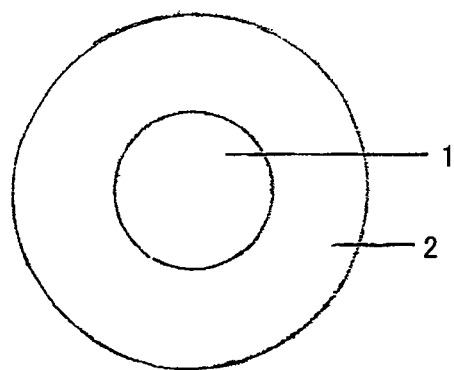
FIG. 10 shows a schematic structure of a core-shell nanoparticle.

A further application of nanocrystals of the current invention is to use the nitride nanocrystal described to prepare a core-shell nanocrystal where one or more shells of different materials to the nanocrystal are grown on the surface on the nanocrystal (which forms the core of the core-shell structure. FIG. 10 shows a schematic view of a core-shell structure; in FIG. 10 the shell 2 is shown as a single layer surrounding the core 1 but the shell 2 may in principle contain two or more layers. Surface coating of nanoparticles with one or more different materials to produce "core-shell" structures is currently an active area of research, because such core-shell structures allow modification and tailoring of physical and chemical properties of the core materials with the degree of modification depending on the shell material(s). Furthermore, core-shell structures are expected to have properties that are not present in either the core or shell materials. More than one shell may be grown over the core.

A nitride material of the invention may be used as a nitride layer disposed around a core to form a core-shell structure. In this case the core may be fabricated by any suitable process, and the core is not limited to a nitride material.

Alternatively, a nitride material of the invention may be used as a nitride core of a core-shell structure. In this case the shell may be fabricated by any suitable process, and the shell is not limited to a nitride material.

As a further alternative, a core-shell structure may have both its core and its shell formed of nitride materials of the invention.

A further application of nanocrystals of the current invention is the use of metal (or boron or silicon) nitride nanocrystals to provide large area illumination panels which are excited by a light source such as a light emitting diode or laser diode.

A further application of nanocrystals of the current invention is the use of metal (or boron or silicon) nitride nanocrystals to provide fluorescent fibres, rods, wires and other shapes.

A further application of nanocrystals of this invention is the use of an electrical current to generate the excited state which decays with the emission of light to make a light emitting diode with direct electrical injection into the nitride nanocrystal.

A further application of nanocrystals of the current invention is the use of metal (or boron or silicon) nitride nanocrystals as part of the back light used in a liquid crystal display.

A further application of nanocrystals of this invention is the use of metal (or boron or silicon) nitride nanocrystals as the emissive species in a display such as a plasma display panel, a field emission display or a cathode ray tube.

A further application of nanocrystals of this invention is the use of metal (or boron or silicon) nitride nanocrystals as the emissive species in an organic light emitting diode.

A further application of nanocrystals of this invention is the use of metal (or boron or silicon) nitride nanocrystals as the emissive species in a solar concentrator, where the light emitted by the solar concentrator is matched to a solar cell used to convert the collected light to an electrical current. More than one such concentrator may be stacked on one another to provide light at a series of wavelengths each matched to a separate solar cell.

A further application of nanocrystals of the current invention is the use of metal (or boron or silicon) nitride nanocrystals as the light harvesting species in an organic solar cell or photo detector.

A further application of nanocrystals of the current invention is the use of metal (or boron or silicon) nitride nanocrystals as the light harvesting species in a dye sensitized solar cell or photo detector.

A further application of nanocrystals of the current invention is the use of metal (or boron or silicon) nitride nanocrystals to generate multiple excitons from the absorption of a single photon though the process of multiple exciton generation in a solar cell or photo detector.

A further application of nanocrystals of the current invention is the use of metal (or boron or silicon) nitride nanocrystals to assist identification in combat.

A further application of nanocrystals of the current invention is the use of metal (or boron or silicon) nitride nanocrystals to assist in asset tracking and marking.

A further application of nanocrystals of this invention is the use of metal (or boron or silicon) nitride nanocrystals as counterfeit inks.

A further application of nanocrystals of this invention is the use of metal (or boron or silicon) nitride nanocrystals as bio markers both in-vivo and in-vitro.

A further application of nanocrystals of this invention is the use of metal (or boron or silicon) nitride nanocrystals in photodynamic therapy.

A further application of nanocrystals of this invention is the use of metal (or boron or silicon) nitride nanocrystals as bio markers in for example cancer diagnosis, flow cytometry and immunoassays.

A further application of nanocrystals of this invention is the use of metal (or boron or silicon) nitride nanocrystals in flash memory.

A further application of nanocrystals of this invention is the use of metal (or boron or silicon) nitride nanocrystals in quantum computing.

A further application of nanocrystals of this invention is the use of metal (or boron or silicon) nitride nanocrystals in dynamic holography.

A further application of nanocrystals of this invention is the use of metal (or boron or silicon) nitride nanocrystals in a thermoelectric device.

A further application of nanocrystals of this invention is the use of metal (or boron or silicon) nitride nanocrystals in a device used in telecommunications.

A further application of nanocrystals of this invention is the use of metal (or boron or silicon) nitride nanocrystals for any application.

EXAMPLES

In the following examples of methods of fabricating a nanocrystal of the present invention, diphenyl ether and 1-octadecene were (where used in an example) distilled under reduced pressure from calcium hydride. All other reagents were used as received (eg from Sigma-Aldrich) though all manipulations and the synthesis were carried out in a glove box using vacuum dried (140° C.) glassware and apparatus.

Example 1

Figure 2:
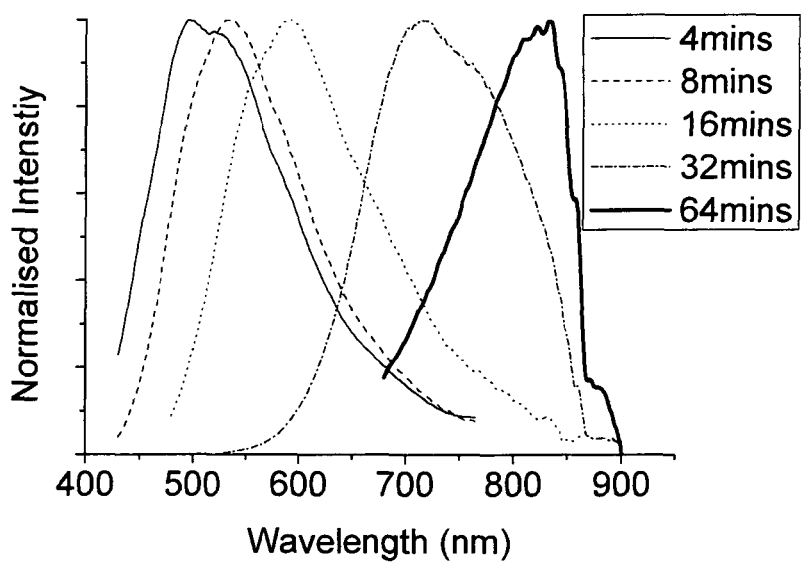
FIG. 2 shows emission spectra of a set of indium nitride nanocrystal solutions obtained from a single reaction at different times.

Indium iodide (300 mg, 0.6 mmol), sodium amide (500 mg, 12.8 mmol), hexadecane thiol (308 μl, 1.0 mmol), zinc stearate (379 mg, 0.6 mmol) and diphenyl ether (20 ml) were heated rapidly to 225° C. Of the constituents, Indium iodide provided a Group III metal (Indium), sodium amide provided nitrogen, hexadecane thiol is a capping agent with an electron-donating group, zinc stearate is a capping agent with an electron-accepting group and diphenyl ether acts as a solvent. Over the course of 60 minutes a number of 0.25 ml portions of the reaction mixture were removed and diluted with cyclohexane (3 ml) and any insoluble materials were removed using a centrifuge. The resulting clear solutions were analysed by absorption and emission spectroscopy and showed a change in the maximum emission wavelength from 480-850 nm over the course of the reaction, as shown in FIGS. 1 and 2. The peak in the emission spectrum has a full width at half the maximum intensity of the order of 150 nm.

To further purify the samples to remove any soluble impurities they were added drop wise to a 1:1 mixture of isopropanol and methanol (30 ml) to precipitate the nanocrystals which can be recovered using a centrifuge. The resulting solids can be redissolved in a second solvent, for example cyclohexane.

When samples from such a reaction are illuminated with a 354 nm light sources, the resultant emission is easily visible with the naked eye for samples emitting in the visible region. This illustrates the high quantum yield of nitride nanoparticles obtainable by the present invention, as light-emission from prior art nitride nanoparticles is usually of too low a level to be visible to the human eye.

Absorption spectra from a series of samples removed from the reaction at the times indicated on the legend are recorded in FIG. 1. This shows that the absorption spectrum changes with time, as a result of the size of the nanoparticles increasing as the reaction continues leading to a change in bandgap of the nanoparticles.

The corresponding emission spectra of these samples are shown in FIG. 2. The emission spectra of samples removed at times up to about one hour span substantially the whole visible region and extend into the infra-red. Thus, nanocrystals having particular optical properties (such as a desired peak emission wavelength) can be obtained by appropriate choice of the reaction period before the nanocrystals are recovered from the solution.

The photoluminescence quantum yield of a sample removed from this reaction was measured using an integrating sphere and gave a value of 10%. This is significantly greater than in the prior art, as prior art nitride nanoparticles have photoluminescence quantum yields well below 1%.

This photoluminescence quantum yield (PLQY) measurement, and all PLQY measurements described herein, are carried out using the procedure described in Analytical Chemistry, Vol. 81, No. 15, 2009, pp 6285-6294. The measurements were carried out on dilute samples of the nitride nanocrystals in cyclohexane with absorbance between 0.04 and 0.1. Nile red in 1,4-dioxane was used as a standard; this has a PLQY 70% (Analytical Biochemistry, Vol. 167, 1987, 228-234). The excitation wavelength was fixed at 450 nm for all nanocrystal samples and for the reference.

Figure 3:
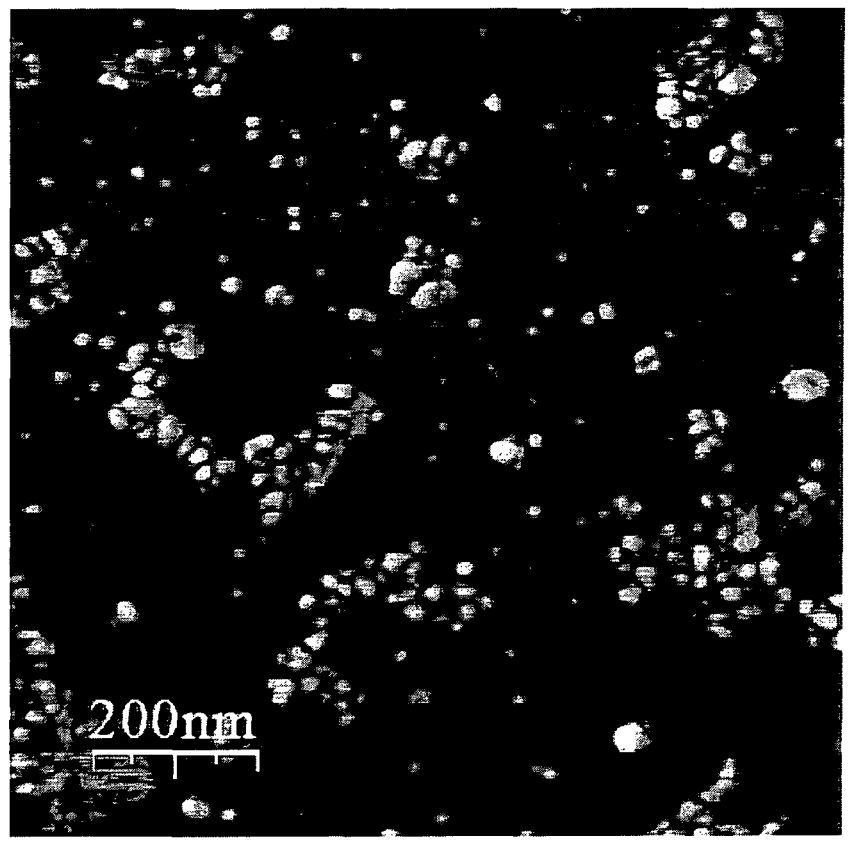
FIG. 3 shows an AFM phase image of indium nitride nanocrystals.
Figure 4:
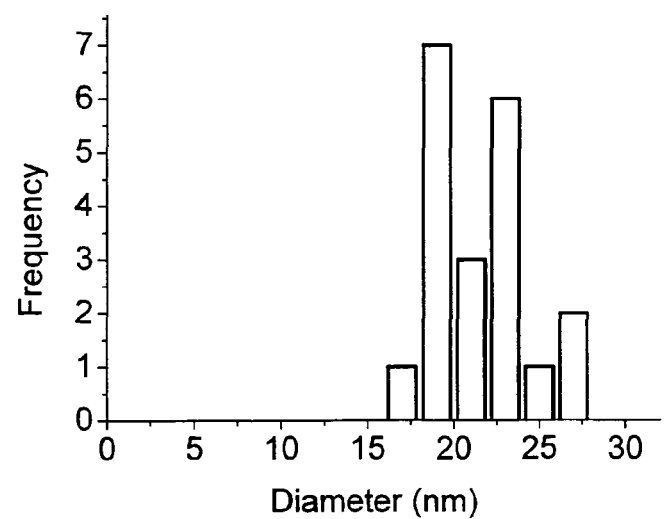
FIG. 4 shows a histogram showing the size distribution of a selection of the nanocrystals show in a FIG. 3.
Figure 5:
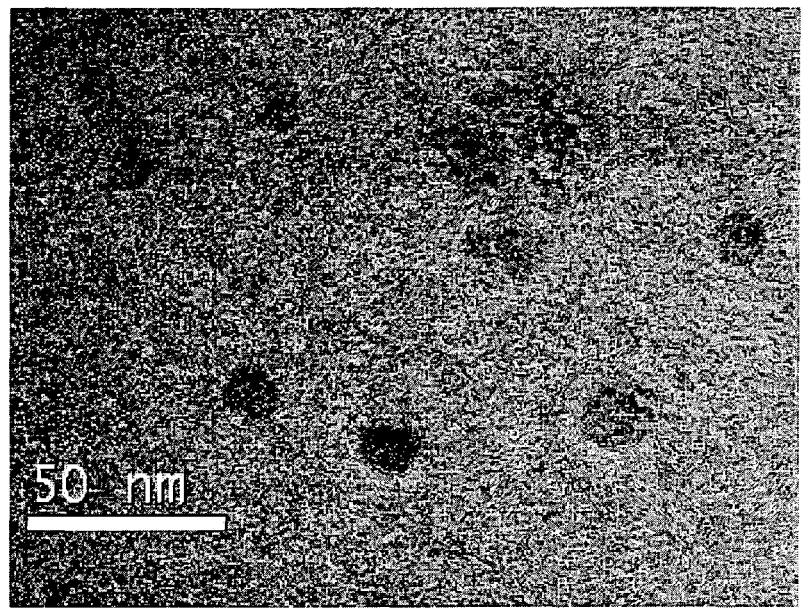
FIG. 5 shows an image from a transmission electron microscope showing a selection of indium nitride nanocrystals.
Figure 6:
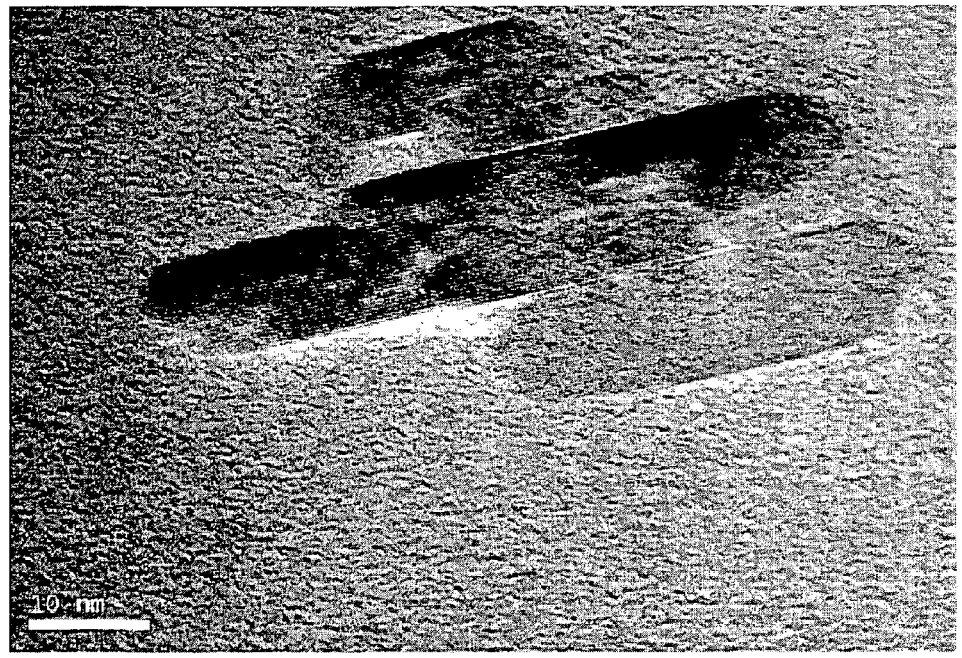
FIG. 6 shows an image from a transmission electron microscope showing a selection of elongated indium nitride nanocrystals.
Figure 7:
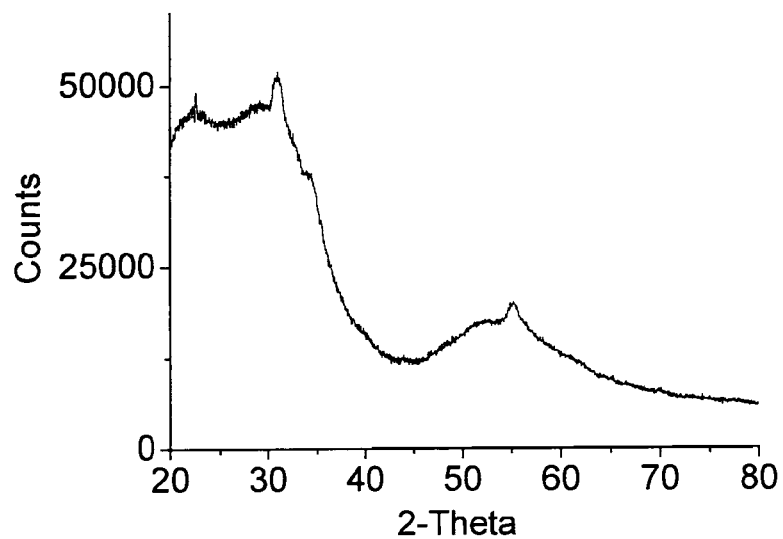
FIG. 7 shows a high resolution x-ray diffraction pattern image of indium nitride nanocrystals deposited on an amorphous silicon substrate.

A sample of InN nanocrystals in cyclohexane was spin coated on to a mica substrate and analysed by atomic force microscopy. FIG. 3 illustrates a phase image of the sample and the individual nanocrystals can clearly be observed. The histogram in FIG. 4 gives an indication of the size of the nanocrystals though the absolute size of the nanocrystals is likely to be smaller than the figures reported here (owing to the finite size of the tip of the atomic force microscope). FIG. 5 shows a TEM image of such a sample deposited onto a holey carbon film. FIG. 6 shows a TEM image of three nanorods found in one sample. FIG. 7 shows a high resolution x-ray diffraction pattern of a sample of indium nitride nanocrystals deposited on an amorphous silicon substrate. The pattern is broad due to the small size of the nanocrystals but follows the expected peak positions for hexagonal indium nitride.

Example 2

Indium iodide (300 mg, 0.6 mmol), sodium amide (500 mg, 12.8 mmol), hexadecane thiol (308 μl, 1.0 mmol), zinc stearate (379 mg, 0.6 mmol) and diphenyl ether (20 ml) were heated rapidly to 250° C. Over the course of 40 minutes 0.25 ml portions of the reaction mixture were removed and diluted with cyclohexane (3 ml) and any insoluble material was removed using a centrifuge. This gives clear solutions of emissive indium nitride nanocrystals. As in example 1, the absorption/emission properties of the obtained nanoparticles depend on the reaction, and show a similar dependence on time to FIGS. 1 and 2.

Example 3

Indium iodide (300 mg, 0.6 mmol), sodium amide (500 mg, 12.8 mmol), palmitic acid (256.4, 1.0 mmol), zinc stearate (379 mg, 0.6 mmol) and diphenyl ether (20 ml) were heated rapidly to 225° C. In this example, palmitic acid is used as a capping agent with an electron-donating group rather than hexadecane thiol.

Over the course of 40 minutes 0.25 ml portions of the reaction mixture were removed and diluted with cyclohexane (3 ml) and any insoluble material was removed using a centrifuge. This gives clear solutions of indium nitride nanocrystals. As in example 1, the absorption/emission properties of the obtained nanoparticles depend on the reaction, and show a similar dependence on time to FIGS. 1 and 2.

Example 4

A mixture of sodium amide (100 mg, 2.56 mmol), zinc stearate (76 mg, 0.12 mmol) and diphenyl ether (3 ml) was added rapidly to a solution of Indium iodide (60 mg, 0.12 mmol) and hexadecane thiol (62 µl, 0.2 mmol) in diphenyl ether (20 ml) heated at 250° C. Samples (0.5 ml) were removed at regular intervals between 6 and 20 minutes and diluted with toluene (3 ml). The emission spectra of the resulting samples show peaks with maxima ranging from 420 nm to 670 nm, depending on the time at which the samples were removed, with the full width at half the maximum ranging from 140-200 nm.

Performing the reaction in this way may result in a more narrow dispersion of nanoparticle size than in Example 1.

Example 5

A hot solution of Indium iodide ($InI_3$) (300 mg, 0.6 mmol) in diphenyl ether (3 ml) was added to a solution of sodium amide (500 mg, 12.8 mmol), hexadecane thiol (612 µl, 2.0 mmol), zinc stearate (760 mg, 1.2 mmol) and diphenyl ether (20 ml) heated at 225° C. Samples (0.5 ml) were removed at regular intervals between 1 and 15 minutes and diluted with hexane (3 ml). The emission spectra of the resulting samples show peaks with maxima ranging from 610 nm to 810 nm, depending on the time at which the samples were removed, with the full width at half the maximum ranging from 152-230 nm.

In examples 2-5, the nanocrystals may be recovered from the solution as described for example 1 above.

In the above examples, the reaction temperature is 225° C. or 250° C. Fabrication of the nitride nanocrystals of the present invention does not however require these reaction temperatures. In general, the higher the reaction temperature the better is the crystal quality of the resultant nitride nanocrystals, so that a reaction temperature of 150° C. is generally preferable. However, for some combinations of constituents, it is expected that acceptable quality crystals may be obtained with reaction temperatures lower than 150° C. and possibly with reaction temperatures as low as room temperature.

Example 6

Use of a soluble nitrogen source has been shown to reduce the full width at half the maximum intensity of the emission peaks, when compare to use of sodium amide as the nitrogen source. One suitable soluble nitrogen source is $(CH_3CH_2)_2NLi$—lithium diethyl amide. By the term "soluble" is meant that the nitrogen source is soluble in the reaction mixture, although this is normally equivalent to requiring that the nitrogen source is soluble in the solvent in which the reaction is performed since the solvent will make up the majority (by volume) of the reaction mixture. The nitrogen source does not need to be fully soluble but improved solubility is beneficial. Other suitable soluble nitrogen sources are other metal amides, such as lithium dimethylamide $[(CH_3)_2NLi]$, lithium dipropylamide $[CH_3(CH_2)_3NLi]$, lithium dibutyl amide $[CH_3(CH_2)_4NLi]$ and other metal amides having the general formula $R_2NM$ where M is a metal and R is a straight or branched alkyl chain. It is believed that the reduction in width of the emission peaks is due to the increased solubility of the nitrogen source leading to a more homogeneous reaction mixture, which allows the growth of the individual nanocrystals to start at the same time as one another—hence during the course of the reaction the individual nanocrystals are more similar in size to one another which leads to narrower emission spectra in the resultant nanocrystals.

Indium iodide (300 mg, 0.6 mmol), lithium diethyl amide (1 g, 12.6 mmol), hexadecane thiol (308 µl, 1.0 mmol), zinc stearate (379 mg, 0.6 mmol) and 1-octadecene (20 ml) were heated rapidly to 225° C. Over the course of 120 minutes a number of 0.25 ml portions of the reaction mixture were removed and diluted with cyclohexane (3 ml), and any insoluble materials were removed using a centrifuge. The resulting clear solutions were analysed by absorption and emission spectroscopy, and this showed that the maximum emission wavelength changed from approximately 500 nm to approximately 600 nm over the course of the reaction. The peak in the emission spectrum has a full width at half the maximum intensity ranging from 110-150 nm which is smaller than observed when sodium amide is used as a nitrogen source.

Example 7

InN—ZnS Core-Shell Nanocrystals

Indium iodide (600 mg, 1.2 mmol), sodium amide (1 g, 15.6 mmol), hexadecane thiol (600 µl, 1.0 mmol), zinc stearate (760 mg, 1.2 mmol) and 1-octadecene (40 ml) were heated rapidly to 250° C. After maintaining the mixture at 250° C. for 30 minutes it was cooled to room temperature and any insoluble material was removed by centrifugation. The darkly coloured solution was decanted from the solids and further treated with zinc diethyl dithiocarbamate (1 g, 2.7 mmol) at 175° C. for 60 minutes. The mixture was cooled to room temperature and any insoluble material was removed by centrifugation to leave a solution of InN—ZnS core-shell nanocrystals. The zinc diethyl dithiocarbamate is a precursor for the ZnS of the shell. The nanocrystals were isolated by precipitation with 200 ml of anhydrous ethanol to leave a dark solid which readily dissolves in cyclohexane. The core-shell nanocrystals show an improved PLQY compared to the core only material.

The core-shell nanocrystals also show improved stability over time compared to the core only material. For core-only materials it has been found that exposure to air causes the emissive properties of the material to degrade and eventually disappear. By coating with zinc sulfide to form a core-shell structure, it is observed that the emissive properties are less sensitive to air and hence the nanocrystals are more stable over time.

Figure 11:
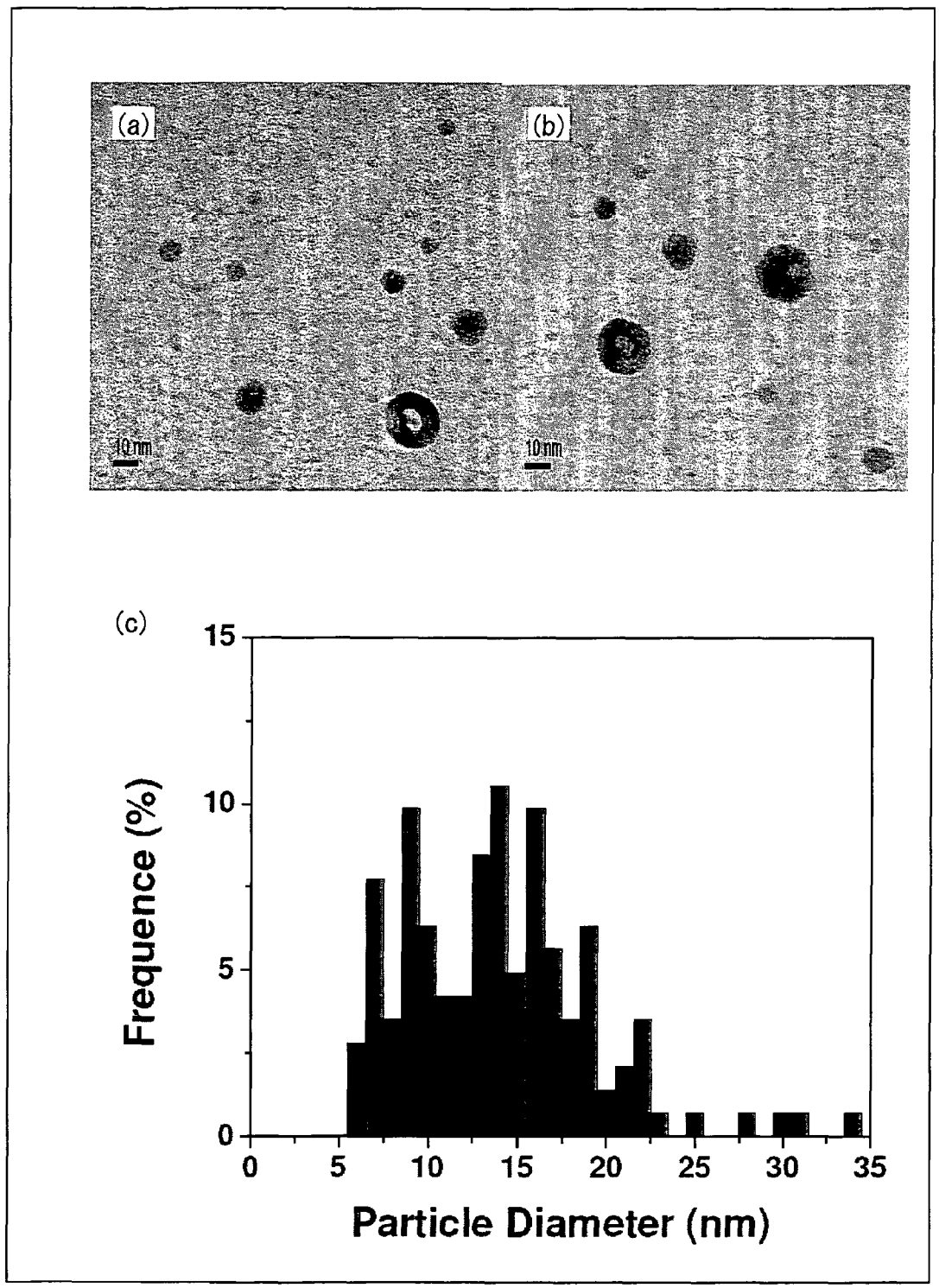
FIGS. 11(a) and 11(b) are TEM micrographs of InN core-only nanoparticles.
FIG. 11(c) is a size histogram of InN core-only nanoparticles.
Figure 12A:
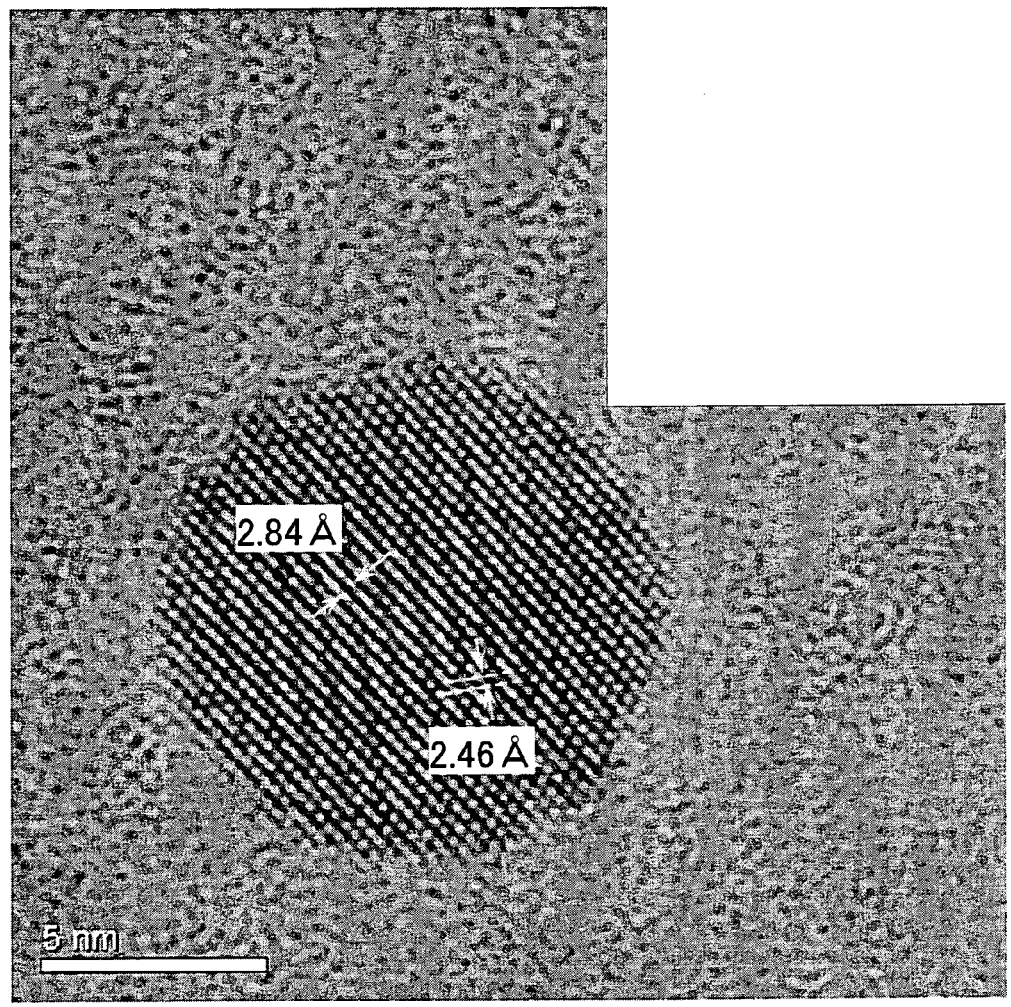
FIG. 12(a) is an HRTEM image of an InN core-only nanoparticle.
Figure 12B:
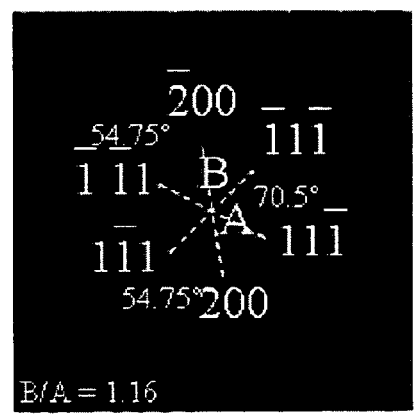
FIG. 12(b) is a Fourier transform of the HRTEM image of FIG. 12(a)

Core-only InN nanocrystals prepared by a method similar to that described in example 7 but omitting the treatment with zinc diethyl dithiocarbamate were isolated by precipitation with ethanol and redissolved in toluene. The toluene solution was drop cast onto a holey carbon TEM grid. The TEM images in FIGS. 11(a) and 11(b) show a number of individual InN core only nanocrystals. Over 100 such nanocrystals were measured to give the size histogram illustrated in FIG. 11(c); the nanocrystals were found to range in size from 6 nm to 34 nm with a mean diameter of 12.7 nm. The high resolution TEM (HRTEM) image shown in FIG. 12(a) shows one such nanocrystal. FIG. 12(a) is an HRTEM image of an InN core-only nanoparticle with a particle diameter of 11 nm. The HRTEM image shows the nanocrystal to be highly crystalline and to have a cubic crystal structure. The observed lattice spacings are consistent with those expected for cubic indium nitride. The structure is further confirmed by the Fourier transform of FIG. 12(a), as shown in FIG. 12(b), which is again consistent with the nanocrystal being composed of cubic indium nitride.

Figure 13:
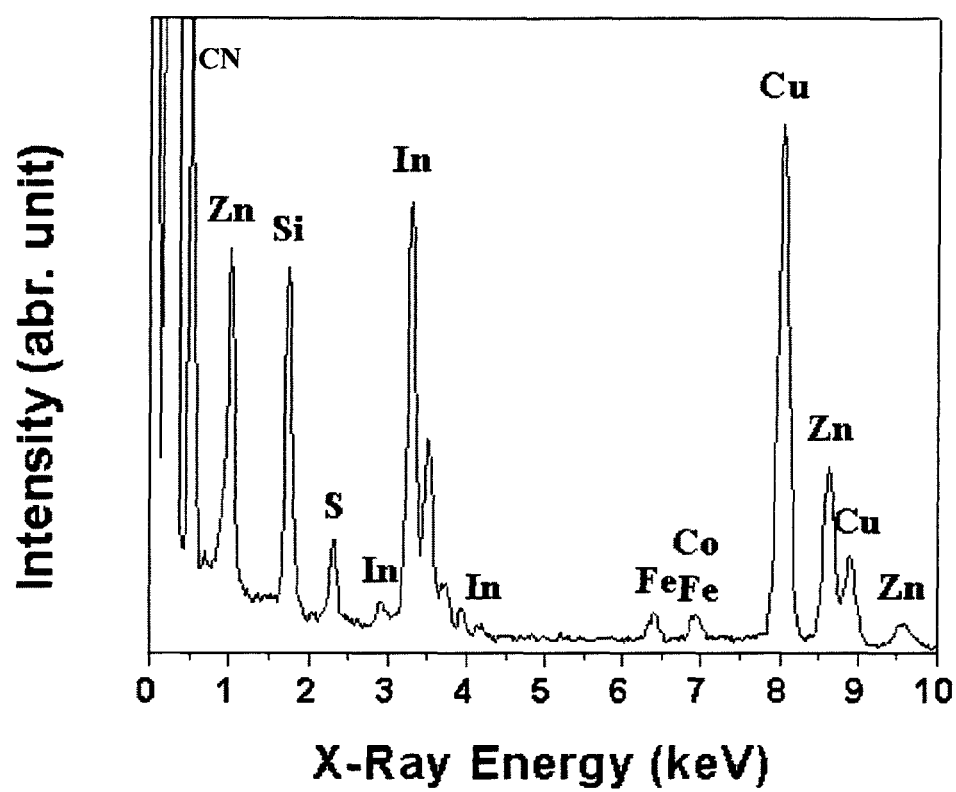
FIG. 13 is an EDX spectrum of an InN core-only nanoparticle.

FIG. 13 shows an EDX (energy-dispersive X-ray spectroscopy) spectrum of the core-only InN nanocrystal and confirms the presence of indium and nitrogen, together with zinc and sulfur from the capping agents. The other elements observed come from either the instrument or the TEM grid.

Figure 14A:
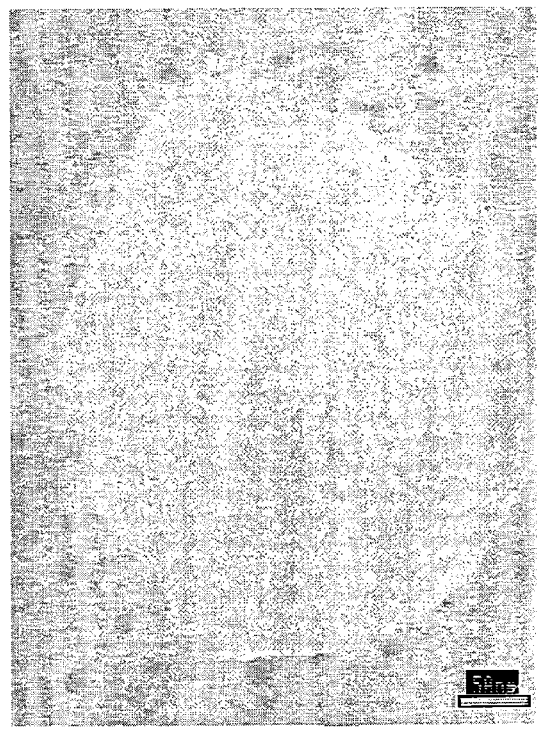
FIG. 14(a) is a TEM micrograph of InN—ZnS core-shell nanoparticles.
Figure 14B:
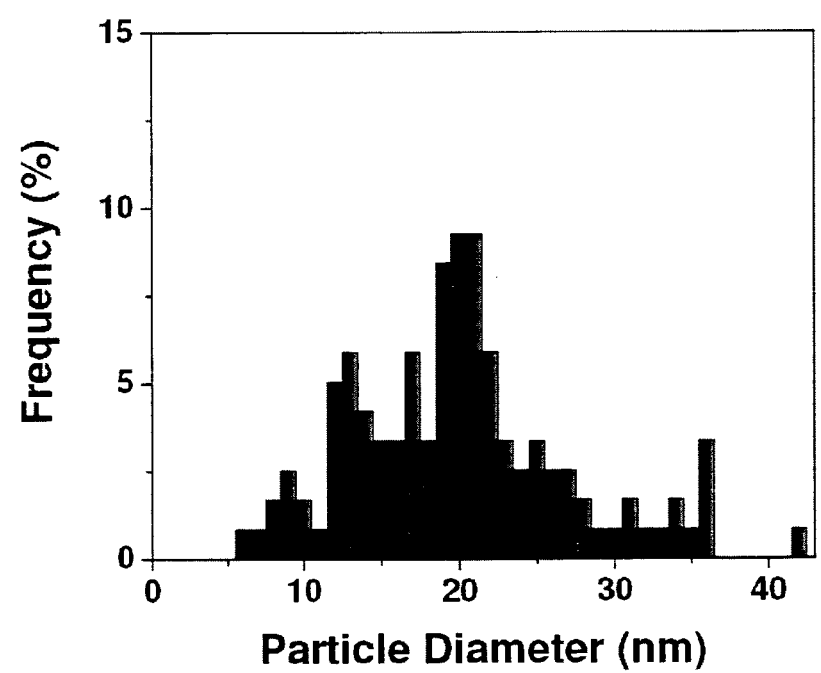
FIG. 14(b) is a size histogram of InN—ZnS core-shell nanoparticles.

Core-shell InN-zinc sulfide nanocrystals prepared as described in example 7 were isolated by precipitation with ethanol and redissolved in toluene. The solution was drop cast onto a holey carbon TEM grid. The TEM images in FIG. 14(a) show a number of individual InN—ZnS core-shell nanocrystals. Over 100 such nanocrystals were measured to give the size histogram illustrated in FIG. 14(b). The nanocrystals were found to range in size from 6 nm to 42 nm with a mean diameter of 19.4 nm. By comparison, the core-only InN the core only material has a size distribution from 6-34 nm with a mean of 12.7 nm—this illustrates that the growth of the ZnS shell has caused an increase in the average size of the nanocrystals as expected.

Figure 15A:
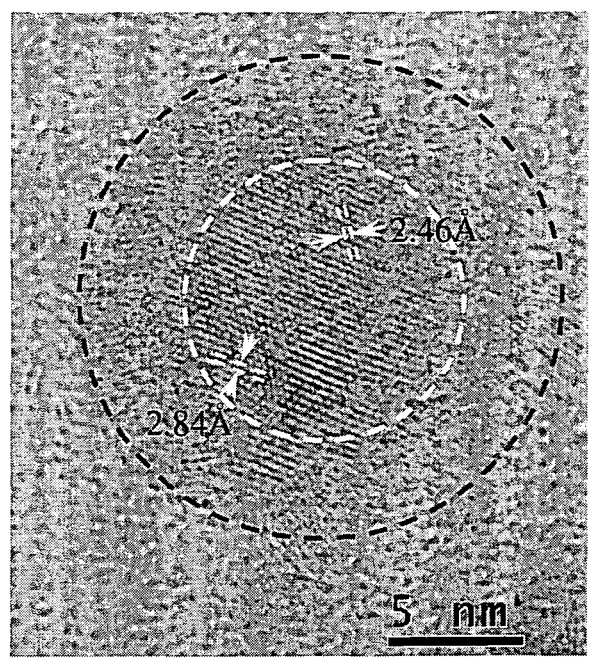
FIG. 15(a) is an HRTEM image of an InN—ZnS core-shell nanoparticle.
Figure 15B:
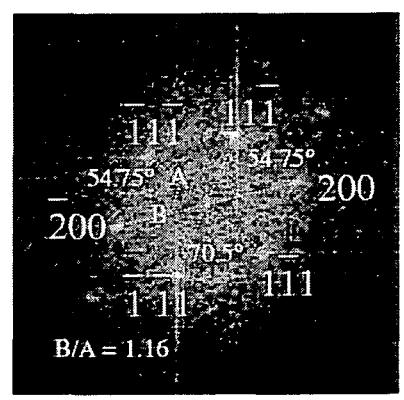
FIG. 15(b) is a Fourier transform of the HRTEM image of FIG. 15(a)

The high resolution TEM image shown in FIG. 15(a) shows one such nanocrystal. FIG. 15(a) is an HRTEM image of the core region of an InN—ZnS core-shell nanoparticle with a particle diameter of 17 nm (core diameter 10 nm). The HRTEM image shows the nanocrystal core to be highly crystalline and to have a cubic crystal structure. The observed lattice spacings are consistent with those expected for cubic indium nitride. An amorphous ZnS shell can also be observed. The structure is further confirmed by the Fourier transform of FIG. 15(a), as shown in FIG. 15(b), which is again consistent with the nanocrystal core being composed of cubic indium nitride.

Figure 16A:
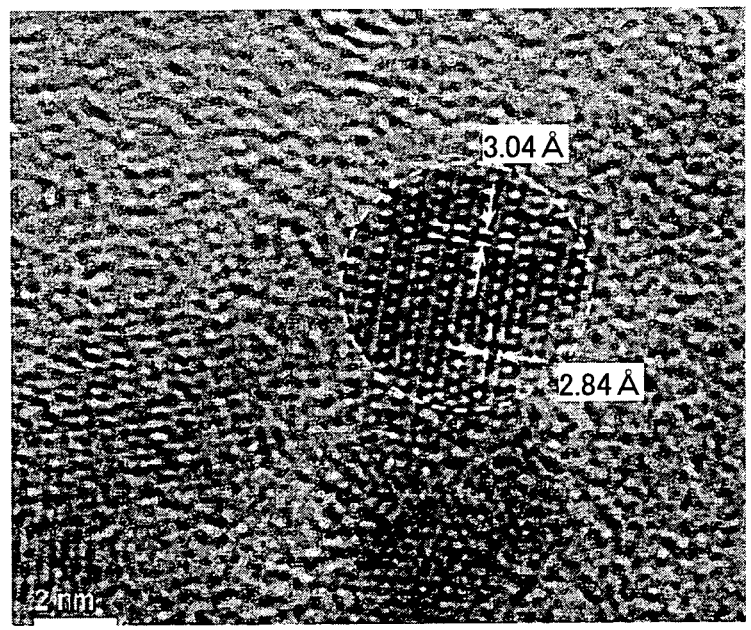
FIG. 16(a) is an HRTEM image of an InN—ZnS core-shell nanoparticle.
Figure 16B:
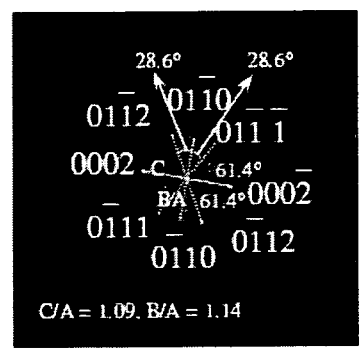
FIG. 16(b) is a Fourier transform of the HRTEM image of FIG. 16(a)

FIG. 16 (a) shows a high resolution TEM image of a smaller nanocrystal, and this has a hexagonal structure (it is not possible to resolve the ZnS shell on this particle). FIG. 16(a) is an HRTEM image of the core region of an InN—ZnS core-shell nanoparticle with a particle diameter of 6 nm (the shell is not resolvable). The Fourier transform of FIG. 16(a), as shown in FIG. 16(b), is consistent with the core being composed on hexagonal indium nitride.

Figure 17:
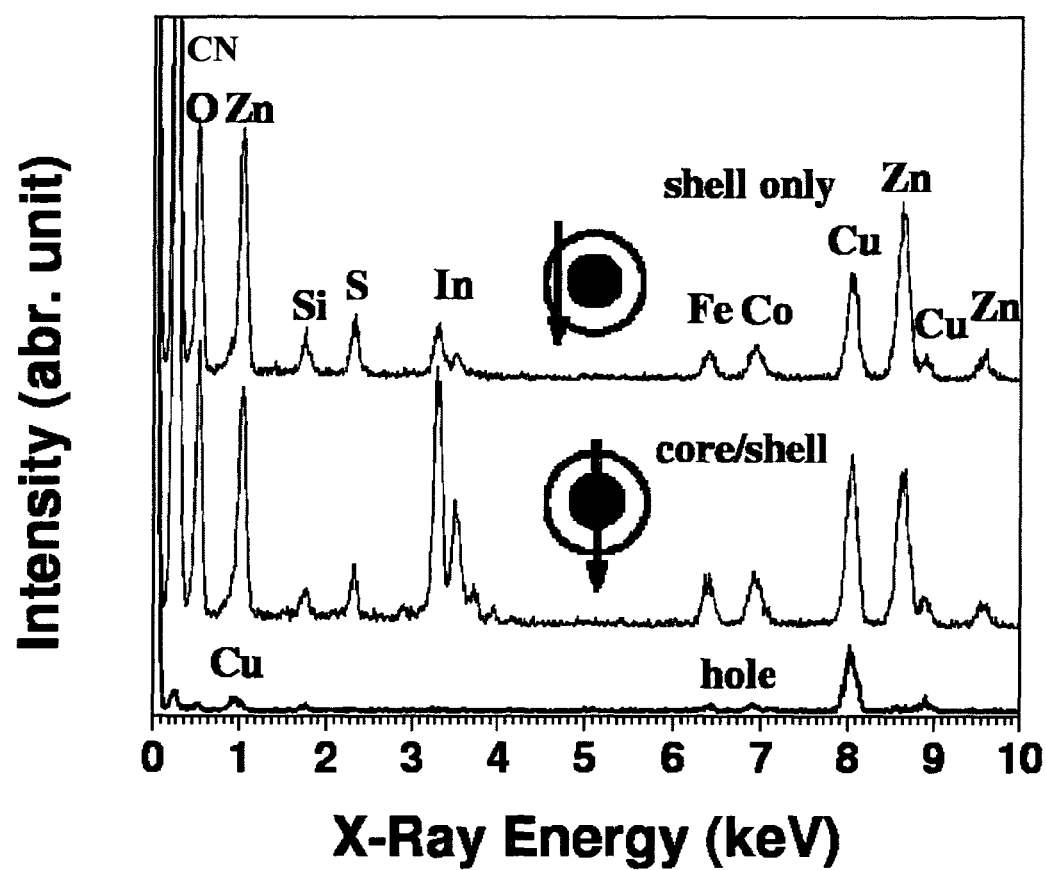
FIG. 17 shows EDX spectra from the core and the shell of an InN—ZnS core-shell nanoparticle.

FIG. 17 shows EDX spectra obtained with a narrow, focused probe beam for the core-shell InN—ZnS nanocrystals having a core diameter of 7 nm and an overall diameter (a particle diameter) of 15 nm. In the upper spectrum the beam passes though just the shell of the nanocrystal and shows this to contain mainly zinc and sulfur as expected. In the middle spectrum the beam passes though both the core and shell of the nanocrystal and, compared to the upper trace (for the shell), more indium is observed—as would be expected. The bottom trace shows the background spectrum obtained when the beam is not passing though the particle.

Example 8

InGaN Nanocrystals

Gallium iodide (113 mg, 0.25 mmol), indium iodide (124 mg, 0.25 mmol), sodium amide (390 mg, 10 mmol), hexadecane thiol (153 μl, 0.5 mmol), zinc stearate (316 mg, 0.5 mmol) and 1-octadecene (40 ml) were heated rapidly to 225° C. and maintained at 225° C. Samples (0.25 ml) were removed after 20, 40 and 60 minutes and diluted with cyclohexane, and the PLQY was measured giving values of 14%, 11% and 10.5% for the 20, 40 and 60 minute samples respectively. It can be seen that addition of gallium iodide to the reaction mixture increase the PLQY of the resultant nanocrystals, presumably due to the incorporation of gallium into the nanocrystals.

Example 9

InGaN—ZnS Core-Shell Nanocrystals

Gallium iodide (113 mg, 0.25 mmol), indium iodide (124 mg, 0.25 mmol), sodium amide (390 mg, 10 mmol), hexadecane thiol (153 μl, 0.5 mmol), zinc stearate (316 mg, 0.5 mmol) and 1-octadecene (40 ml) were heated rapidly to 225° C. After maintaining the mixture at 225° C. for 60 minutes the mixture was cooled to room temperature and centrifuged to remove any insoluble material. The resultant darkly coloured solution was decanted from the solids and further treated with zinc diethyl dithiocarbamate (1 g, 2.7 mmol) at 175° C. for 60 minutes. The mixture was cooled to room temperature and any insoluble material was removed by centrifugation to leave a solution of InGaN—ZnS core-shell nanocrystals. The PLQY of the nanocrystals was measured to be 18%—indicating that growth of a ZnS shell on InGaN nanocrystals improves the PLQY and stability over time.

Example 10

InGaN—ZnS Core-Shell Nanocrystals

Gallium iodide (113 mg, 0.25 mmol), indium iodide (124 mg, 0.25 mmol), sodium amide (390 mg, 10 mmol), hexadecane thiol (153 μl, 0.5 mmol), zinc stearate (316 mg, 0.5 mmol) and 1-octadecene (40 ml) were heated rapidly to 225° C. After maintaining the mixture at 225° C. for 20 minutes the mixture was cooled to room temperature and centrifuged to remove any insoluble material. The resultant highly coloured solution was decanted from the solids and a 4 ml sample was treated with zinc diethyldithiocarbamate (100 mg, 0.27 mmol) for 40 minutes at 175° C. The resulting nanocrystals had a PLQY of 23%—again indicating that growth of a ZnS shell on InGaN nanocrystals improves the PLQY and stability.

Example 11

InGaN—GaN Core-Shell Nanocrystals

Gallium iodide (113 mg, 0.25 mmol), indium iodide (124 mg, 0.25 mmol), sodium amide (390 mg, 10 mmol), hexadecane thiol (153 μl, 0.5 mmol), zinc stearate (316 mg, 0.5 mmol) and 1-octadecene (40 ml) were heated rapidly to 225° C. After maintaining the mixture at 225° C. for 20 minutes the mixture was cooled to room temperature and centrifuged to remove any insoluble material. 20 ml of the resulting solution was further treated with gallium iodide (113 mg, 0.25 mmol) and sodium amide (185 mg, 5 mmol), heated to 225° C. and maintained at 225° C. for 20 minutes. The resulting nanocrystals were measured to have a PLQY of 28%. This indicates that the growth of a gallium nitride shell onto InGaN nanocrystals improves the PLQY to a greater extent than does a zinc sulfide shell.

Example 12

InGaN—GaN—ZnS Core-Shell-Shell Nanocrystals

Gallium iodide (113 mg, 0.25 mmol), indium iodide (124 mg, 0.25 mmol), sodium amide (390 mg, 10 mmol), hexadecane thiol (153 μl, 0.5 mmol), zinc stearate (316 mg, 0.5 mmol) and 1-octadecene (40 ml) were heated rapidly to 225° C. After maintaining the mixture at 225° C. for 20 minutes the mixture was cooled to room temperature and centrifuged to remove any insoluble material. 20 ml of the resulting solution was further treated with gallium iodide (113 mg, 0.25 mmol) and sodium amide (185 mg, 5 mmol) and heated to 225° C. for 20 minutes. The resulting solution was centrifuged to remove any insoluble material and then treated with zinc diethyldithiocarbamate (500 mg, 1.35 mmol), heated to 175° C. and maintained at 175° C. for a period of 60 minutes. The resulting nanocrystals were measure to have a PLQY of 21.5%. This is an example of growth of a ZnS shell onto GaN-coated InGaN nanocrystals, leading to a core-shell-shell structure. As in other core-shell structures, the shell improves the stability over time of the nanocrystals.

It can therefore be seen that the present invention makes possible the fabrication of nitride nanocrystals, in particular Group III metal nitride nanocrystals, that have good light-emissive properties. Nanocrystals having particular optical properties (such as a desired peak emission wavelength) can be obtained by appropriate choice of the reaction period before the nanocrystals are recovered from the solution.

It should be noted that the invention is not limited to the specific examples described above, and that the examples may be varied without falling outside of the scope of the invention. For example, the invention is not limited to the specific materials, or combinations of materials, given in the specific examples described above. As one example, the nanocrystals of Example 11 or 12 may be embodied with an InN core rather than an InGaN core.

Nanocrystals obtained by a method of the invention may then undergo further processing, for example to allow them to be used in any of the applications mentioned above. As examples, nanocrystals obtained by a method of the invention may undergo further processing to incorporate them into a light source (for example a light source in which the nanocrystals are illuminated by light from an exciting light source) or to provide one or more shells of different material(s) around the nanocrystals to provide a core-shell structure in which the nanocrystals form the core. Any suitable processing steps may be applied to nanocrystals obtained by a method of the invention, and these further processing steps will not be described in detail.

Preferred embodiments of the invention have been described with reference to nanocrystals. The nanoparticles of the invention are not however limited to nanocrystals, and may be nanoparticles with an amorphous structure.

The invention has been described with particular reference to fabrication of light-emissive nitride nanocrystals. The invention is not however limited to this, and may also be applied to manufacture of nitride nanocrystals that are not light-emissive.

For a fuller understanding of the nature and advantages of the invention, reference should be made to the ensuing detailed description taken in conjunction with the accompanying drawings.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

The invention claimed is:

1. A nitride nanoparticle, the nanoparticle comprising at least one capping agent containing at least one of an electron-donating functional group and an electron accepting functional group, the nanoparticle being a light-emissive nanoparticle and having a photoluminescence quantum yield of at least 1%.

2. A nitride nanoparticle as claimed in claim 1 and having a photoluminescence quantum yield of at least 5%.

3. A nitride nanoparticle as claimed in claim 1 and having a photoluminescence quantum yield of at least 10%.

4. A nitride nanoparticle as claimed in claim 1 and having a photoluminescence quantum yield of at least 20%.

5. A nitride nanoparticle as claimed in claim 1 and comprising: a nitride crystal, at least one dimension of the nitride crystal being of a nanoscale dimension; and the at least one capping agent provided on a surface of the nitride crystal and containing an electron-accepting functional group for passivating nitrogen atoms of the nitride crystal and located at the surface of the nitride crystal.

6. A nitride nanoparticle comprising: a nitride crystal, at least one dimension of the nitride crystal being of a nanoscale dimension; and at least one capping agent provided on a surface of the nitride crystal and containing an electron-accepting functional group, the electron accepting functional group containing a metal, boron or silicon.

7. A nanoparticle comprising: a core; a nitride layer disposed around the core; and at least one capping agent provided on a surface of the nitride layer and containing an electron-accepting functional group, the electron accepting functional group containing a metal, boron or silicon.

8. A nitride nanoparticle as claimed in claim 6 and having a photoluminescence quantum yield of at least 1%.

9. A nitride nanoparticle as claimed in claim 5 wherein the nitride crystal contains metal, boron or silicon atoms and wherein the at least one capping agent further contains an electron-donating group for passivating metal, boron or silicon atoms of the nitride crystal and located at the surface of the nitride crystal.

10. A nitride nanoparticle as claimed in claim 5 wherein the nitride crystal contains metal, boron or silicon atoms and wherein the at least one capping agent includes a first capping agent having an electron-accepting group for passivating nitrogen atoms of the nitride crystal and located at the surface of the nitride crystal and second capping agent having an electron-donating group for passivating metal, boron or silicon atoms of the nitride crystal and located at the surface of the nitride crystal.

11. A nitride nanoparticle as claimed in claim 5 wherein the electron-accepting functional group includes a metal, boron or silicon.

12. A nitride nanoparticle as claimed in claim 6 wherein the electron-accepting functional group includes a Group II metal or a Group III element.

13. A nitride nanoparticle as claimed in claim 6 wherein the electron accepting functional group contains at least one of aluminium, gallium and indium.

14. A nitride nanoparticle as claimed in claim 6 wherein the electron-accepting functional group includes a metal selected from the group consisting of: Sc, Ti, V, Cr, Mn, Fe, Co, Ni, Cu, Zn, Zr, Ag, Mo, Ru, Pd, Cd, Ta, W, Os, Ir, Pt, Au and Hg.

15. A nitride nanoparticle as claimed in claim 6, wherein the electron-accepting functional group comprises a metal amide, metal carboxylate, metal acetoacetonate, metal sulfonate, metal phosphonate, metal thiocarbamate, or metal thiolate.

16. A nitride nanoparticle as claimed in claim 9, wherein the electron-donating group is selected from the group consisting of: phosphines, phosphine oxides, carboxylic acids, carboxylates, amines, sulfonates, esters, thiols and thiolates.

17. A nitride nanoparticle as claimed in claim 5, wherein the nitride crystal is a crystal of a metal, boron or silicon nitride having the formula $M_xN_y$ where M denotes a metal, boron or silicon and x and y are integers.

18. A nitride nanoparticle as claimed in claim 5, wherein the nitride crystal comprises two or more metals, boron or silicon and has the general formula $M1_{x1}M2_{x2}M3_{x3} \ldots Mn_{xn}N_y$ where M1, M2, M3 ... Mn denote different metals, boron or silicon, x1, x2, x3 ... xn denote the quantities of the metals, boron or silicon and y denotes the quantity of nitrogen.

19. A nitride nanoparticle as claimed in claim 17 wherein the or each metal is a Group III metal.

20. A nitride nanoparticle as claimed in claim 5, wherein the nitride crystal is a crystal of indium nitride.

21. A nitride nanoparticle as claimed in claim 20 wherein the at least one capping agent includes a zinc carboxylate.

22. A nitride nanoparticle as claimed in claim 5, wherein the nitride crystal forms a core of the nanoparticle and the nanoparticle further comprises a shell disposed around the core.

23. A nitride nanoparticle as claimed in claim 22 wherein the core is an InN core or an InGaN core.

24. A nitride nanoparticle as claimed in claim 22 wherein the shell is a ZnS shell.

25. A nanoparticle as claimed in claim 7 and having a photoluminescence quantum yield of at least 1%.

26. A nanoparticle as claimed in claim 7 wherein the nitride layer contains metal, boron or silicon atoms and wherein the at least one capping agent further contains an electron-donating group for passivating metal, boron or silicon atoms of the nitride layer and located at the surface of the nitride layer.

27. A nanoparticle as claimed in claim 7 wherein the nitride layer contains metal, boron or silicon atoms and wherein the at least one capping agent includes a first capping agent having an electron-accepting functional group for passivating nitrogen atoms of the nitride layer and located at the surface of the nitride layer and a second capping agent having an electron-donating group for passivating metal, boron or silicon atoms of the nitride layer and located at the surface of the nitride layer.

28. A nanoparticle as claimed in claim 7 wherein the electron-accepting functional group includes a Group II metal or a Group III element.

29. A nanoparticle as claimed in claim 7 wherein the electron accepting functional group contains at least one of aluminium, gallium and indium.

30. A nanoparticle as claimed in claim 7 wherein the electron-accepting functional group includes a metal selected from the group consisting of: Sc, Ti, V, Cr, Mn, Fe, Co, Ni, Cu, Zn, Zr, Ag, Mo, Ru, Pd, Cd, Ta, W, Os, Ir, Pt, Au and Hg.

31. A nanoparticle as claimed in claim 7 wherein the electron-accepting functional group comprises a metal amide, metal carboxylate, metal acetoacetonate, metal sulfonate, metal phosphonate, metal thiocarbamate, or metal thiolate.

32. A nanoparticle as claimed in claim 7, wherein the nitride layer forms a shell disposed around the core of the nanoparticle.

33. A nanoparticle as claimed in claim 10, wherein the first capping agent or the second capping agent has both an electron accepting functional group and an electron donating functional group.

34. A nanoparticle as claimed in claim 27, wherein the first capping agent or the second capping agent has both an electron accepting functional group and an electron donating functional group.

* * * * *